United States Patent
Wu et al.

(10) Patent No.: US 6,299,788 B1
(45) Date of Patent: Oct. 9, 2001

(54) SILICON ETCHING PROCESS

(75) Inventors: Kuang-Yung Wu, Taoyuan; Tien-Min Yuan, Taipei; Shih-Chi Lai, Hsinchu Hsien, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/277,375

(22) Filed: Mar. 29, 1999

(51) Int. Cl.⁷ ........................................ C23F 1/00
(52) U.S. Cl. .................. 216/79; 216/67; 216/49; 438/689; 438/696; 438/730; 438/714; 438/719
(58) Field of Search ..................... 438/689, 696, 438/730, 714, 719; 216/67, 79, 49

(56) References Cited

U.S. PATENT DOCUMENTS

| | | | |
|---|---|---|---|
| 4,490,209 | * 12/1984 | Hartman | 156/643 |
| 5,767,018 | * 6/1998 | Bell | 438/696 |
| 5,948,703 | * 9/1999 | Shen et al. | 438/714 |
| 6,008,139 | * 12/1999 | Pan et al. | 438/730 |

* cited by examiner

*Primary Examiner*—Randy Gulakowski
*Assistant Examiner*—Michael Kornakov
(74) *Attorney, Agent, or Firm*—Nath & Associates; Harold L. Novick

(57) ABSTRACT

A method for polysilicon etching with HBr, He and He/$O_2$ as reactive gas source is disclosed. A chamber pressure greater than 30 mTorr is held to achieve high selectivity to polysilicon over silicon oxide. A total flow rate of HBr and He greater than 420 sccm is provided. Under this condition of the total flow rate of HBr and He, the flow rates of HBr and He are respectively held in the range of about 180–280 sccm, and the flow rate of He/$O_2$ is at about 5–10 sccm.

20 Claims, 1 Drawing Sheet

SILICON ETCHING PROCESS

BACKGROUND OF THIS INVENTION

1. Field of the Invention

The present invention relates to a semiconductor process, and more especially, to an etching process with high selectivity to polysilicon over silicon oxide but without hardening to photoresist.

2. Description of the Prior Art

Etching process, which includes dry etching and wet etching, is used to remove some materials from a wafer. The wet etching is usually applied to isotropically strip an entire film or a residual film that has been undergone some other processes, by using etchant dissolved in a solution. The dry etching is generally applied to anisotropically remove a portion of a film to transfer a pattern from a mask, by using plasma gases as an etching source.

One of the important structures that needs for pattern transference is the gate electrode of a metal-oxide-semiconductor field effect transistor (MOSFET), which is typically used doped polysilicon as the material, and, of course, an anisotropic etching as plasma etching will be a suitable method to carry out this pattern transference. Considering about the selectivity between polysilicon and silicon dioxide used for gate oxide, the plasma source applied to anisotropically etch polysilicon can be chloride containing gases including $Cl_2$, HCl, and $SiCl_4$, and so on. Another preferred plasma source for polysilicon etching is HBr, which can provide a better selectivity to polysilicon over silicon dioxide, and is frequently used in high integration semiconductor process, with He and $He/O_2$ mixing together.

In a polysilicon etching system using HBr, He and $He/O_2$ as the etching gases, the process chamber is kept in a pressure greater than 30 mTorr. The flow rate of HBr, He and $He/O_2$ are in the range of about 100–200 sccm, 100–200 sccm and 5–10 sccm respectively, with a total flow rate at about 200 to 300 sccm. These flow rates can be controlled by the pumping system and the valves deposed on the gas delivery lines. With such a process parameters choice, a high selectivity about to polysilicon over silicon dioxide can be achieve, and the gate oxide under the polysilicon gate electrode can substantially be prevented from the etching reaction. An ultra-thin gate oxide and a semiconductor MOSFET device with high integration can therefore be attended.

However, in above standard operating conditions used in polysilicon etching by HBr, the plasma gases will react with the material of the photoresist used for pattern. Materials of polymer are produced in this reaction as by-product. This by-product of polymer has a harder structure than the original photoresist material, and the photoresist is thus hardened. The hardened photoresist is difficult to be stripped, and needs a complex post treatment. Moreover, in extreme situation, the produced by-product of polymer can distribute on the reactive film and behave as hard mask to obstruct the proceeding of the etching. Therefore, it needs a proper method to deal with this problem of photoresist hardening.

In the conventional manner, the photoresist is stripped by a two-step process after patterning. In general, an photoresist ashing process, normally a dry etching, followed by a wet cleaning, can provide a complete removal for the ordinary photoresist. However, for the hardened photoresist, an additional photoresist ashing process is needed after the wet cleaning, because the original two steps can not efficiently clear all the hardened photoresist.

Alternatively, a hard mask such as nitride mask can be utilized to cover a portion of polysilicon film instead of the photoresist during the etching process to prevent the producing of polymer. By this way, the photoresist hardening is no long a problem, but the hard mask forming process is much complex than the photoresist mask. For instance, it takes a nitride deposition, a photolithography process, a nitride etching, and a photoresist stripping before polysilicon etching, and a nitride stripping after. In the mean time, the photoresist mask takes only photolithography process and photoresist stripping.

No matter adding a photoresist ashing process after the wet cleaning, or using a hard mask instead of the photoresist mask, it takes extra process to solve the photoresist-hardening problem, and will loss efficiency and cost a higher capital. Both of these two methods are not the most ideal way to solve the problem of photoresist hardening causing by the producing of polymer.

SUMMARY OF THE INVENTION

The present invention proposes a method for polysilicon etching with HBr, He and $He/O_2$ as reactive gas source. A chamber pressure greater than 30 mTorr is held to achieve high selectivity to polysilicon over silicon oxide. A total flow rate of HBr and He greater than 400 sccm is provided. Under this condition of the total flow rate of HBr and He, the flow rates of HBr and He are respectively held in the range of about 180–280 sccm, and the flow rate of $He/O_2$ is at about 5–10 sccm. The polymer produced at the etching process by the reaction between plasma gases and photoresist can thus be minimized.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
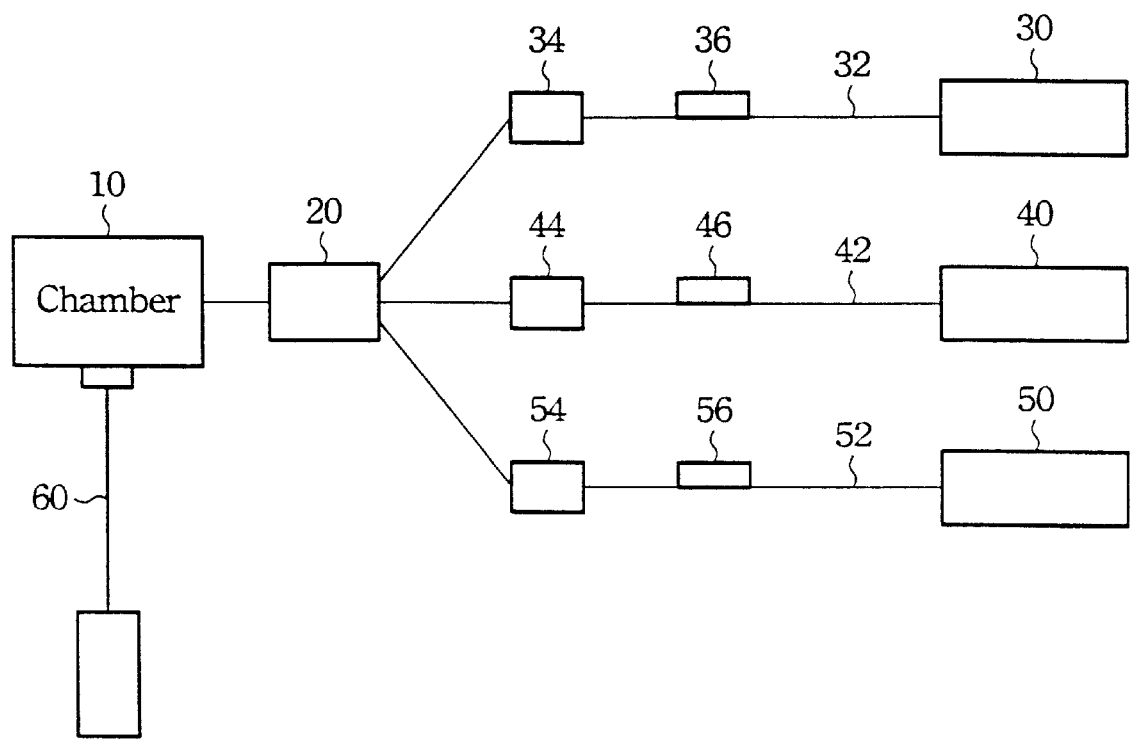
FIG. 1 is a schematic view of a portion of a polysilicon plasma etching system including a gas delivery system used to bring plasma gas into and out from a polysilicon-etching chamber according to the present invention.

The present invention proposes a method for polysilicon etching with HBr, He and $He/O_2$ as reactive gas source. A chamber pressure greater than 30 mTorr is held to achieve high selectivity to polysilicon over silicon oxide. A total flow rate of HBr and He greater than 400 sccm is provided to prevent polymer produced at the etching process by the reaction between plasma gases and photoresist.

FIG. 1 depicts schematically a portion of the polysilicon plasma-etching system including a gas delivery system used to bring plasma gas of HBr, He and $He/O_2$ into a wafer etching process chamber 10, where the polysilicon on the wafer is etched by the plasma gases. The gases of HBr, He and $He/O_2$, are brought to a mixing port 20 from the source 30, 40 and 50 through the delivery lines 32, 42 and 52 respectively, to be mix together well. The well-mixed plasma gases are then introduced into the etching process chamber 10.

At the beginning, the plasma gases in the etching process chamber 10 are exhausted through the exhaust port 60 to stabilize the process conditions including the gas flow and the chamber pressure. To achieve a high selectivity to polysilicon over silicon oxide, the pressure of the process chamber 10 must be kept greater than 30 mTorr. In a preferred embodiment, a pressure at about 50 to 80 mTorr is provided in the etching process chamber 10. In addition, to prevent polymer produced at the etching process by the reaction of plasma gases with photoresist, the total flow rate of HBr and He is controlled greater than 400 sccm while the chamber pressure is greater than 30 mTorr. In a preferred embodiment, the total flow rate of HBr and He is controlled greater than 420 sccm. Under this condition of the total flow rate of HBr and He, the flow rates of HBr and He are respectively held in the range of about 180–280 sccm, and the flow rate of He/$O_2$ is at about 5–10 sccm.

These flow rates of the plasma gases are typically regulated by the pumping system (not shown in the figure) and the control valves 34, 44 and 54 deposed on the delivery lines. Three gauges 36, 46 and 56 can also be deposed on the delivery lines to detect the flow rates respectively. When the individual flow rates are stable, the desired total flow rate of HBr and He can be obtain by adjusting the individual flow rates of HBr and He in the range limited with above condition. When the stabilization of the gas flow are achieved, the gas in the process chamber are drawn to the surface of the wafer, and the polysilicon etching process is carried out by reactive ion etching (RIE). The post-reaction gases of the process are then exhausted through the exhaust line 60.

According to the present invention using HBr, He and He/$O_2$ as reactive gas source for polysilicon etching with above process parameter choice, a high selectivity to polysilicon over silicon dioxide can be achieved. The problem that polymer produced at the etching process by the reaction of plasma gases and photoresist is also solved. The polysilicon gate electrode can be patterned without substantially damage to the gate oxide under the polysilicon film. An ultra-thin gate oxide and a semiconductor MOSFET device with high integration can thus be attended without the interference from the photoresist reaction.

In practical, the present method to delivery gases into process chamber for etching polysilicon can be applied to polysilicon etching systems of different type or using in different wafer chamber. Particularly, the present invention is applied to the Lam Research TCP 9400 plasma polysilicon-etching system.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method to provide gases into a process chamber for etching polysilicon under a patterned photoresist layer, said method comprises:
   delivering HBr and He gases to the process chamber at a total flow rate greater than 400 sccm to avoid generating a hardened polymer on a surface of the patterned photoresist layer.

2. The method according to claim 1, wherein said process chamber is kept in a pressure greater than 30 mTorr.

3. The method according to claim 2, wherein said process chamber is kept in the range of about 50 to 80 mTorr.

4. The method according to claim 1, wherein said total flow rate of HBr and He is controlled at the range greater than 420 sccm.

5. The method according to claim 1, wherein said HBr gas is delivered at a flow rate in the range of about 180 to 280 sccm.

6. The method according to claim 1, wherein said He gas is delivered at a flow rate in the range of about 180 to 280 sccm.

7. The method according to claim 1 further comprises additionally delivering mixture gases of He/$O_2$ into said process chamber at a flow rate of about 5 to 10 sccm.

8. The method according to claim 5, wherein said gases of HBr, He and He/$O_2$ are delivered to a mixing port before arriving at said process chamber.

9. The method according to claim 1 is applied to a plasma polysilicon-etching system.

10. A method to provide gases into a process chamber for etching polysilicon under a patterned photoresist, said method comprises:
    delivering HBr gas at a flow rate in the range of about 180 to 280 sccm; and
    delivering He gas at a flow rate in the range of about 180 to 280 sccm, such that the total flow rate of HBr and He are controlled greater than 400 sccm to avoid generating a hardened polymer on a surface of the patterned photoresist.

11. The method according to claim 10, wherein said process chamber is kept in a pressure greater than 30 mTorr.

12. The method according to claim 11, wherein said process chamber is kept in a pressure in the range of about 50 to 80 mTorr.

13. The method according to claim 10, wherein said total flow rate of HBr and He is controlled at the range greater than 420 sccm.

14. The method according to claim 10 further comprises additionally delivering mixture gases of He/$O_2$ into said process chamber at a flow rate of about 5 to 10 sccm.

15. The method according to claim 14, wherein said gases of HBr, He and He/$O_2$ are delivered to a mixing port before arriving at said process chamber.

16. The method according to claim 10 is applied to a plasma polysilicon-etching system.

17. A method to provide gases into a process chamber for etching polysilicon under a patterned photoresist, wherein said process chamber is kept in a pressure greater than 30 mTorr, said method comprises:
    delivering HBr gas at a flow rate in the range of about 180 to 280 sccm;
    delivering He gas at a flow rate in the range of about 180 to 280 sccm, such that the total flow rate of HBr and He are controlled greater than 420 sccm to avoid generating a hardened polymer on a surface of the patterned photoresist; and
    additionally delivering mixture gases of He/$O_2$ at a flow rate in the range of about 5 to 10 sccm.

18. The method according to claim 17, wherein said process chamber is kept in a pressure in the range of about 50 to 80 mTorr.

19. The method according to claim 17, wherein said gases of HBr, He and He/$O_2$ are delivered to a mixing port before arriving at said process chamber.

20. The method according to claim 17 is applied to a plasma polysilicon-etching system.

* * * * *